US010008849B2

(12) United States Patent
Wild (10) Patent No.: US 10,008,849 B2
(45) Date of Patent: Jun. 26, 2018

(54) SURGE PROTECTION DEVICE (71) Applicant: John Mezzalingua Associates, LLC, Liverpool, NY (US)

(72) Inventor: Werner Wild, Buttenwiesen (DE)

(73) Assignee: JOHN MEZZALINGUA ASSOCIATES, LLC, Liverpool, NY (US)

( * ) Notice: Subject to any disclaimer, the term of this patent is extended or adjusted under 35 U.S.C. 154(b) by 0 days. days.

(21) Appl. No.: 15/689,337

(22) Filed: Aug. 29, 2017

(65) Prior Publication Data

US 2017/0365985 A1   Dec. 21, 2017

Related U.S. Application Data

(62) Division of application No. 14/212,551, filed on Mar. 14, 2014, now Pat. No. 9,774,173.

(60) Provisional application No. 61/789,627, filed on Mar. 15, 2013.

(51) Int. Cl.
*H02H 9/04* (2006.01)
*H01R 24/48* (2011.01)
*H01T 4/12* (2006.01)
*H05K 1/02* (2006.01)

(52) U.S. Cl.
CPC .............. *H02H 9/041* (2013.01); *H01R 24/48* (2013.01); *H01T 4/12* (2013.01); *H05K 1/0257* (2013.01); *H05K 2201/09809* (2013.01)

(58) Field of Classification Search
CPC ........ H02H 9/041; H02H 9/044; H02H 9/045; H05K 1/0257; H01R 24/48; H01T 4/00–4/20
See application file for complete search history.

(56) References Cited

U.S. PATENT DOCUMENTS

| 4,633,359 | A | * | 12/1986 | Mickelson | ............. | H01R 24/48 |
| | | | | | | 361/119 |
| 5,315,684 | A | | 5/1994 | Szegda | | |
| 5,371,819 | A | | 12/1994 | Szegda | | |
| 5,724,220 | A | * | 3/1998 | Chaudhry | ............. | H01R 24/48 |
| | | | | | | 361/103 |
| 6,510,034 | B2 | | 1/2003 | Palinkas et al. | | |
| 6,636,407 | B1 | * | 10/2003 | Ryman | ................... | H01P 1/202 |
| | | | | | | 361/113 |
| 6,683,773 | B2 | | 1/2004 | Montena | | |
| 6,930,872 | B2 | | 8/2005 | Palinkas et al. | | |
| 7,102,868 | B2 | | 9/2006 | Montena | | |
| 7,161,785 | B2 | | 1/2007 | Chawgo et al. | | |
| 7,420,794 | B2 | | 9/2008 | Olcen | | |

(Continued)

FOREIGN PATENT DOCUMENTS

EP   0518597 A2   12/1992
EP   0518597 A3    4/1993
(Continued)

*Primary Examiner* — Thienvu Tran
*Assistant Examiner* — Christopher Clark
(74) *Attorney, Agent, or Firm* — Barclay Damon LLP (57) ABSTRACT

A surge protection device includes, in one embodiment, a surge responder operative to engage an inner conductor engager during a protection mode and disengage the inner conductor engager during a normal mode. The surge responder returns to the normal mode from the protection mode without operating intervention to replace or re-engage the surge responder.

20 Claims, 6 Drawing Sheets

(56) References Cited

U.S. PATENT DOCUMENTS

| | | |
|---|---|---|
| 7,892,005 B2 | 2/2011 | Haube |
| 8,125,752 B2 | 2/2012 | Montena |
| 8,134,818 B2* | 3/2012 | Alkan ............... H01P 1/202 |
| | | 361/116 |
| 8,259,430 B2 | 9/2012 | Alkan |
| 2002/0064014 A1* | 5/2002 | Montena ............. H01T 4/08 |
| | | 361/117 |
| 2002/0171992 A1 | 11/2002 | Palinkas et al. |
| 2003/0103309 A1 | 6/2003 | Palinkas et al. |
| 2004/0057186 A1 | 3/2004 | Chawgo et al. |
| 2006/0023386 A1 | 2/2006 | Palinkas et al. |
| 2006/0061931 A1 | 3/2006 | Olcen |
| 2009/0251840 A1* | 10/2009 | Alkan ............... H01P 1/202 |
| | | 361/119 |
| 2010/0095344 A1 | 4/2010 | Newby et al. |
| 2010/0265625 A1* | 10/2010 | Montena ............. H01T 4/08 |
| | | 361/119 |
| 2010/0297871 A1 | 11/2010 | Haube |
| 2011/0075311 A1 | 3/2011 | Alkan |
| 2011/0075312 A1 | 3/2011 | Alkan |
| 2012/0088405 A1* | 4/2012 | Wild ............... H01R 24/564 |
| | | 439/585 |
| 2013/0003243 A1* | 1/2013 | Depping ............. H01T 1/14 |
| | | 361/118 |
| 2013/0090010 A1* | 4/2013 | Darrow ............. H02H 9/06 |
| | | 439/620.03 |

FOREIGN PATENT DOCUMENTS

| | | |
|---|---|---|
| WO | 2005029665 A2 | 3/2005 |
| WO | 2009126669 A2 | 10/2009 |
| WO | 2009126669 A3 | 1/2010 |
| WO | 2010120834 A2 | 10/2010 |
| WO | 2011038258 A2 | 3/2011 |
| WO | 2011038260 A2 | 3/2011 |

* cited by examiner

SURGE PROTECTION DEVICE

PRIORITY CLAIM

This application is a divisional application and claims the benefit and priority of non-provisional U.S. patent application Ser. No. 14/212,551, entitled "Surge Protection Device and Method" filed on Mar. 14, 2014, which claims the benefit and priority of U.S. Provisional Patent Application No. 61/789,627, filed on Mar. 15, 2013. The entire contents of such applications are hereby incorporated by reference.

BACKGROUND

Surge protection protects electronic devices from voltage spikes due, for example, to lightning. These devices block or short-to-ground, voltage above a certain threshold. In the coaxial cable industry, gas discharge tubes (GDT) provide surge protection and employ sealed glass-enclosed devices containing a special gas mixture trapped between two electrodes. The gas mixture conducts electric current upon ionization by a high voltage spike. Quarter wave devices also provide surge protection and feature a tuned quarter-wavelength short-circuit stub that allows the surge protector to pass a bandwidth of frequencies, but presents a short to other frequencies. Existing surge protection technologies each have their own drawbacks including, but not limited to, the high cost of manufacture, complexity, the burden to reset or replace the surge protectors, surge protection delay, low reliability, and the like.

Accordingly, there is a need to overcome, or otherwise lessen the effects of, the disadvantages and shortcomings described above.

SUMMARY

According to one embodiment, a surge protection device comprises a first coupling portion, a second coupling portion and a body extendable along a longitudinal axis and positioned between the first and second coupling portions. An inner conductor engager is configured to be at least partially received by the body and is also extendable along the axis. The inner conductor engager comprises a first end, a second end and a protrusion between the first and second ends. A surge responder is configured to be at least partially received by the body and is positioned adjacent to the protrusion. The surge responder is configured to automatically change from a disengaged form to an engaged form in response to a surge wherein the surge responder engages the protrusion to provide a ground path for the surge. The surge responder is further configured to automatically change back to the disengaged form after the surge stops wherein the surge responder disengages the protrusion.

Additional features and advantages of the present disclosure are described in, and will be apparent from, the following Brief Description of the Drawings and Detailed Description.

DETAILED DESCRIPTION

Figure 1:
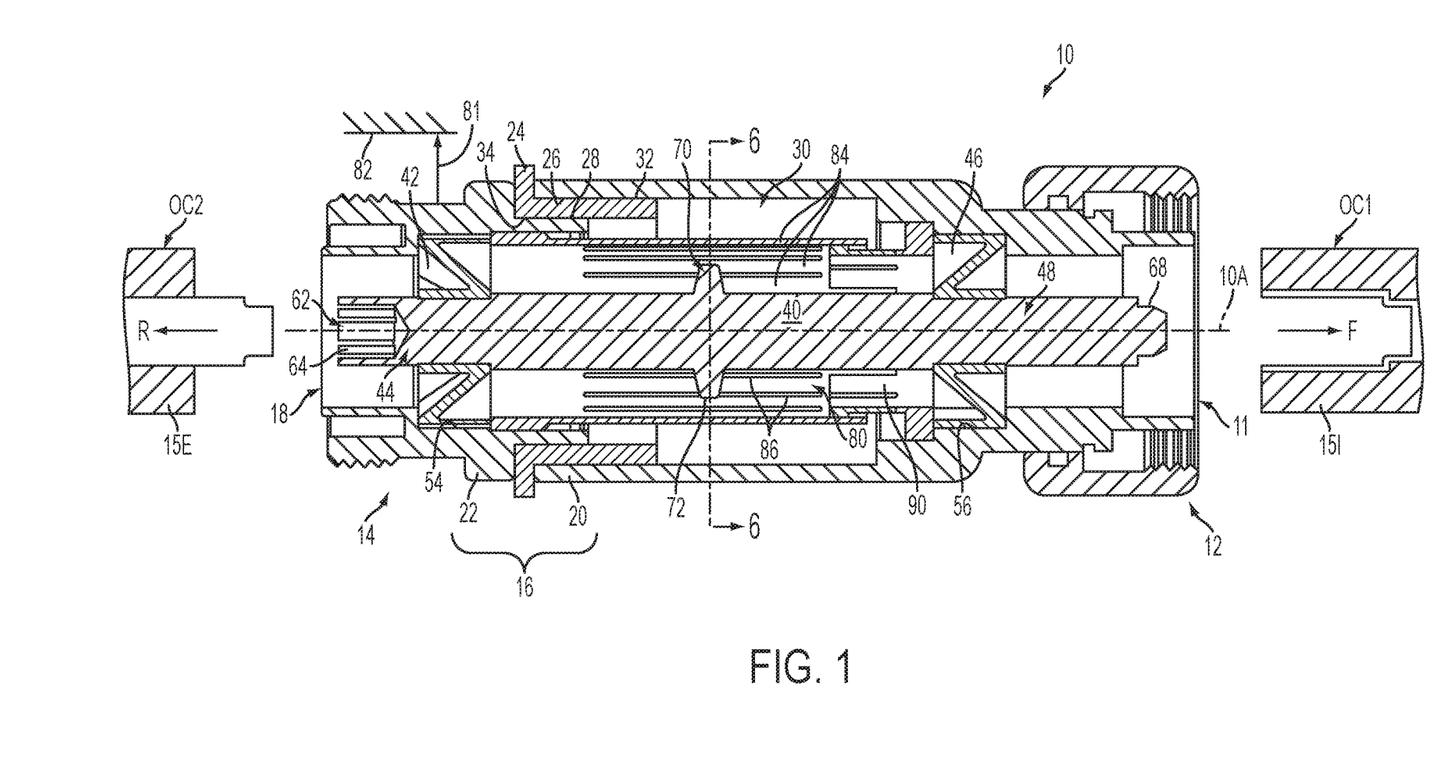
FIG. 1 depicts a sectional side view of an in-line surge protector or surge protection device according to one embodiment of the disclosure.
Figure 2:
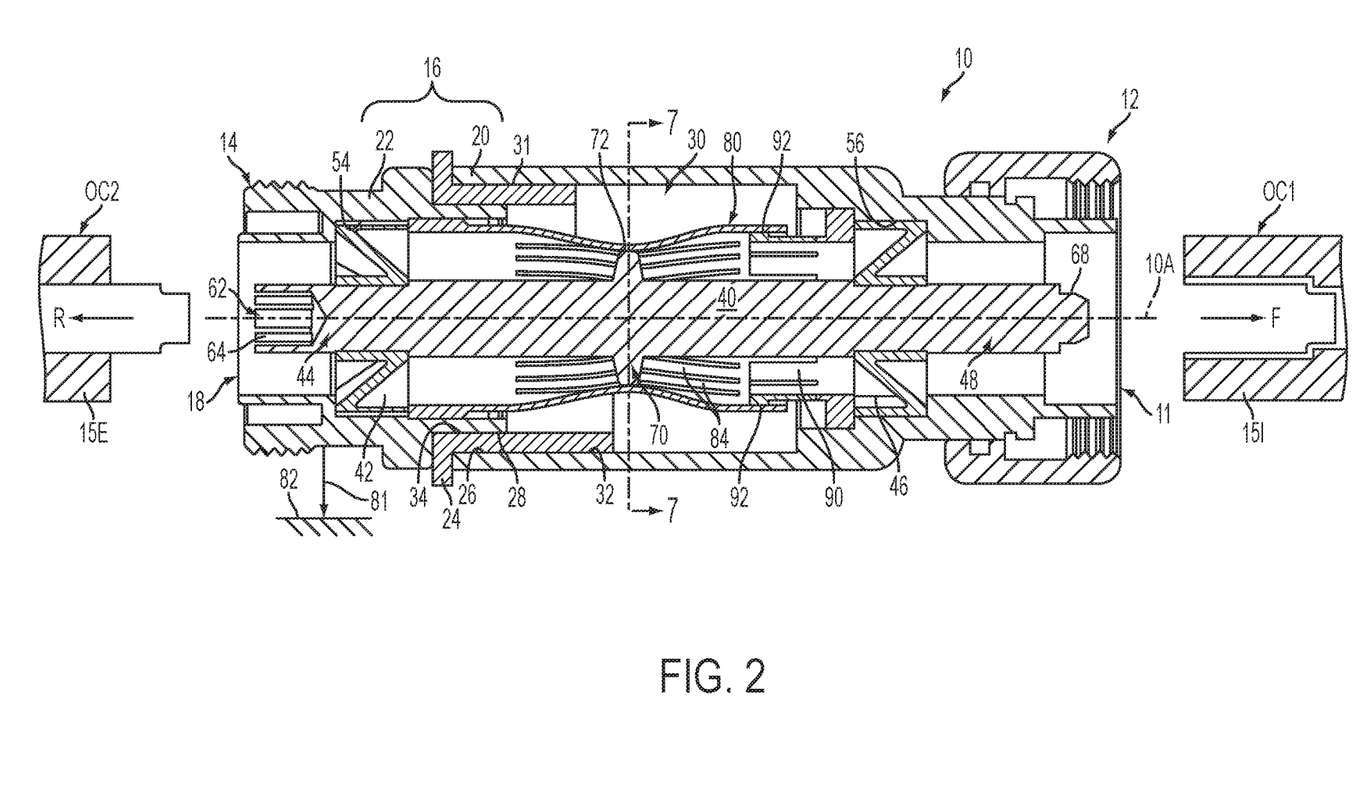
FIG. 2 depicts a sectional side view of the in-line surge protector or surge protection device of FIG. 1 during a surge protection event.

Referring to FIGS. 1 and 2, sectional side views of an in-line surge protector or surge protection device 10 are shown both prior to and during a surge event. In the described embodiment, the surge protector or surge protection device 10 integrates in-line with a coaxial communications system or network. In one embodiment, the forward end 11 of the surge protection device 10, facing in a forward direction F, is operatively connected to one portion of the network, such as an interface port 151 or male end of a coaxial cable OC1. The rearward end 18 of the surge protection device 10, facing in a rearward direction R, is operatively connected to another portion of the network, such as the female end 15E of a coaxial cable OC2.

Depending upon the embodiment, the network can be a telecommunications, cable/satellite TV ("CATV") network operable to process and distribute different RF signals or channels of signals for a variety of services, including, but not limited to, TV, Internet and voice communication by phone. In another embodiment, the network can be a cellular phone network operable to process and distribute wireless cellular phone signals for the operation of wireless device, including, but not limited to, cell phones, smartphones, tablets, laptops and other mobile communication devices.

The surge protector 10 includes a first coupling portion 12, a second coupling portion 14 and a conductive body 16 extending between the first and second coupling portions 12, 14. The first coupling portion 12 includes a plurality of male threads for coupling to a threaded female fitting of a first coaxial cable (not shown). The second coupling portion 14 includes a threaded nut rotatable about an axis 10A of the surge protector 10. The threaded nut engages a threaded male fitting of a second coaxial cable (not shown). While the surge protector 10 is described in the context of a communication system, it should be understood that the principles of the present disclosure are not limited thereto and may be applied to other systems such as fiber optic cables, data exchange systems, computer networks, cloud computing, etc.

The body 16 of the surge protector 10 includes a first housing 20, a second housing or extension element 22, and an insulating sleeve 24 disposed between an internal edge 26 of the first housing 20 and an external lip 28 of the second housing or extension element 22. The first and second housings 20, 22 define an internal cavity 30 for enclosing the surge protecting components and define mating interfaces therebetween for enabling access to the internal cavity 30. That is, the first housing 20 may break-away from the second housing 22 to enable assembly and disassembly of the surge protecting components. More specifically, the body 16 extends along a longitudinal axis 10A such that the first and second housings 20, 22 slide apart along cylindrical outer and inner surfaces 32, 34 of the insulating sleeve 24.

In one embodiment, the conductive body 16 is electrically connected to ground. A ground wire 81, in one embodiment, connects the body 16 to earth ground or a grounded object 82. It should be appreciated that the body 16 can be grounded through any suitable grounding device.

The first housing 20 rotationally mounts the first coupling portion 12, i.e., the threaded nut, of the surge protector 10 while the second housing 22 transitions to define the second coupling portion 14 thereof. As such, the surge protector 10 may be mounted in-line between first and second coaxial cables or network-connected devices (not shown).

The functional elements of the surge protector 10 include an inner conductor engager 40 and a surge responder 80, each extendable along, and coaxial relative to, the longitudinal axis 10A. The inner conductor engager 40 and surge responder 80 are each fabricated from conductive materials. The inner conductor engager 40 is at least partially received within the body 16 and generally takes the form of a rod, tube, pin, dowel or shaft extending the length of the surge protector 10, i.e., from the first to the second coupling portions 12, 14. Furthermore, the inner conductor engager 40 is mounted between, and supported by, a first insulator block 42 at a first end 44 of the inner conductor engager 40 and a second insulator block 46 at a second end 48 of the inner conductor engager 40. The first insulator block 42 mounts within a bearing race 54 of the first housing 20 while the second insulator block 46 mounts within a race 56 of the second housing 22.

The first end 44 of the inner conductor engager 40 includes an inner conductor receptacle or receiver 60 for receiving RF signals from one of the network-connected devices or coaxial cables. The inner conductor receiver 62 comprises a plurality of fingers 64 which define an aperture which is smaller in cross-sectional dimension than the transmitting pin (not shown) of the applicable network-connected device. Therefore, the fingers 64 receive, engage and retain the transmitting pin of the applicable coaxial cable or network-connected device. The second end 48 of the inner conductor engager 40 includes a pin 68 for transmitting RF signals from the surge protector 10 to another coaxial cable or network-connected device. The pin 68 is received within a signal receiving fitting, interface or port (not shown) having a central RF pin receptacle.

Figure 6:
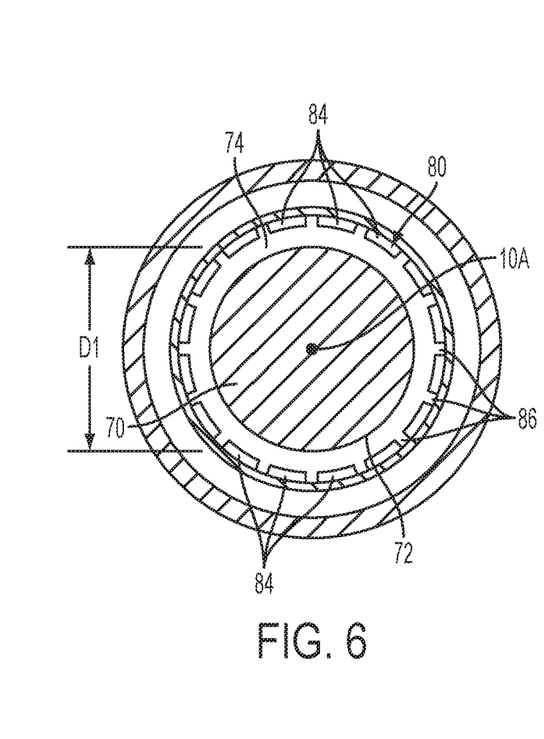
FIG. 6 is a cross-sectional view taken substantially along line 6-6 of FIG. 1 wherein a plurality of surge strips are displaced from a radial protrusion of an inner conductor engager of the surge protector.

In FIGS. 1 and 6, a conductive portion, radial extension or radial protrusion 70 is disposed between the first and second ends 44, 48 of the inner conductor engager 40. In the illustrated embodiment, the radial extension or protrusion 70 projects outwardly in a radial direction from the longitudinal axis 10A and defines a radial disc having a peripheral surface 72 which is disposed adjacent to an inner diameter D1 (see FIG. 6) of the surge responder 80. The radial disc may be mounted to or integrally formed with the central inner conductor engager 40. In a normal operating mode, e.g., a non-surge protection mode, the surge responder 80 is predisposed to define an annular gap 74 between the peripheral surface 72 of the radial protrusion 70 and the inner diameter D1 of the surge responder 80.

The surge responder 80 is configured to be at least partially received by the body 16 and is extendable along the axis 10A. Furthermore, the surge responder 80 is configured to at least partially receive the inner conductor engager 40 and, further is configured to be electrically grounded to earth ground or a grounded object 82 Additionally, the surge responder 80 comprises a plurality of elongate flexible elements or strips 84 which extend along, and are parallel to, the axis 10A. More specifically, the responder 80 includes first and second rings 88 at each end of the responder 80. The slots 86 extend between the rings 86 to define the strips 84 of the responder 80.

Figure 7:
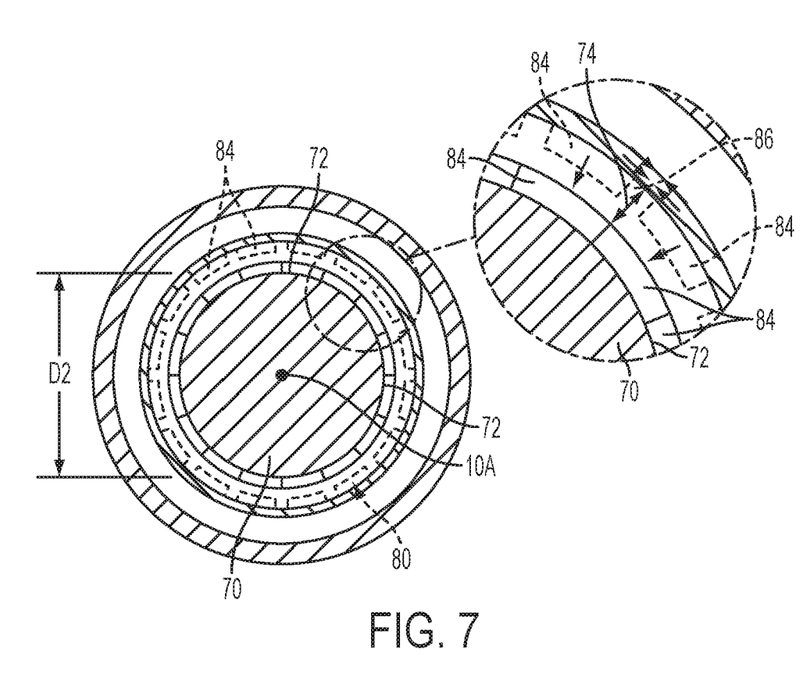
FIG. 7 is a cross-sectional view taken substantially along line 7-7 of FIG. 1 wherein the surge strips produce a magnetic flux field during a surge event, and wherein the strips deform inwardly to contact a radial protrusion of an inner conductor engager of the surge protector.

In the normal operating mode, the strips 84 define a substantially cylindrical shape with the inner diameter D1 forming the annular gap 74 between the responder 80 and the radial protrusion 70 as illustrated in FIGS. 1 and 7. In the normal operating mode, RF signals are exchanged across the inner conductor engager 40, e.g., between the inner conductors of each of the coaxial cables or network-connected devices. In one embodiment, the surge responder 80 provides an electrical grounding path across the outer conductors of each of the coaxial cables. That is, during normal operating mode, the surge responder 80 functions as a conventional outer braid or conductor of a coaxial cable. In this operating mode, the annular gap functions as an insulator between the radial protrusion 70 of the inner conductor engager 40 and the conductive strips 84 of the surge responder 80.

During a surge event, i.e., in a surge condition or mode, shown in FIGS. 2 and 7, the network experiences an electrical surge. Depending upon the circumstances, the electrical surge can include a sharp increase or spike in electrical current or voltage due to a natural cause (e.g., weather or lightning) or a human cause (e.g., malfunction, disturbance or damage of an electrical grid). During the surge, a relatively high level of current can flow through the inner and outer conductors of a network-connected device (e.g., a coaxial cable). To protect the networked devices, the inner conductor engager 40 can receive part of the high current, and the conductive body 16 can receive the other part of the high current.

The surge responder 80 is in electrical contact with the conductive body 16. Therefore, upon arriving at the surge responder 80, the high current flows through surge strips 84 separated by the slots 86. In one embodiment, the increased current flowing through the strips 84 induces a magnetic field around the strips 84, and between the strips 84 and the inner conductor engager 40. The magnetic field and high current flowing through the strips 84 and the inner conductor engager 40 cause the strips 84 to be magnetically attracted to each other. In one embodiment, the magnetic field and high current flowing through the strips 84 also causes the strips to be magnetically attracted to the radial protrusion 70. This phenomena is produced by current flowing in the same direction across conductive elements in parallel or substantially in parallel.

The attractive magnetic effect or field causes the strips 84 of the surge responder 80 to collapse or contract inwardly toward the longitudinal axis 10A such that the surge strips 84 contact the peripheral surface 72 of the radial protrusion 70. Viewed from a different perspective, the magnetic effect or field narrows the elongate slots or openings 86 causing at least one of the strips 84 to deform or move radially inwardly against the radial protrusion 70.

When the responder 80 is collapsed onto the protrusion 72, the high surge current flows from the inner conductor engager 40 to the protrusion 72, to the responder 80, to the conductive body 16, to the ground wire 81, then to ground. This protects the downstream networked devices, that is, the devices connected rearward of the rearward end R. The excess, and potentially damaging current, is diverted to the collapsed responder 80, and then to ground 82.

In the illustrated embodiment, the surge strips 84 are responsive to the surge current or surge effect to contract radially inward from a disengaged configuration or form to an engaged configuration or form against the surface 72 of the radial protrusion 70. Moreover, the strips 84 collectively deform from the first diameter D1 to a smaller second diameter D2 corresponding to the outer diameter of the radial protrusion 70. Therefore, during a normal mode, the annular gap 74 between the radial protrusion 70 and cylindrically arranged strips 84 of the responder 80 is open. During a surge protection, or protect mode, the annular gap 74 closes enabling electricity to flow from the inner conductor engager 40, to the radial protrusion 70, to the surge responder 80 and to the grounded object 82.

More specifically, when the strips 84 of the surge responder 80 engage or contact the radial protrusion 70 of the inner conductor engager 40, a short-to-ground is created. As such, the potential across the inner conductor engager 40 and surge responder 80 reduces to a zero- or no-voltage condition, thereby protecting any device (e.g., TV) connected down-line of the surge protector 10. While the strips 84 are shown in intimate contact with the peripheral surface 72 of the radial protrusion 70 to effect a short-to-ground, the strips 84 need not contact the surface 72 to effect a short. Additionally, not all of the strips 84 need to deform inwardly to effect a protective short. That is, the strips 84 may deform sufficiently close to the peripheral surface 72 to cause electric current to arc between the strips 84 and the peripheral surface 72. Moreover, only one or a few of the strips 84 may effect a short sufficient to protect devices down-line of the surge protector 10.

Once the surge current stops, is removed or dissipates, the strips 84 of the surge responder 80 automatically return to the disengaged form from the engaged form. That is, in the absence of the surge current, the magnetic field dissipates such that the strips 84 spring-back to their predisposed, original diameter D1, i.e., from the engage diameter D2. As a consequence, the surge protector 10 is reversible without the intervention of an operator or service technician to replace or re-set a surge element which has deformed, tripped or changed-state.

In the embodiment shown, the radial protrusion 70 and surge responder 80 may have a generally circular or cylindrical shape, however, other geometric shapes and dimensions are contemplated. For example, the annular gap 74 may be larger or smaller during the normal or non-surge mode of operation. In another embodiment, the slots 86 between the surge strips 84 may be larger or smaller depending upon the flexibility of the strips 84. In still other embodiments, the inner conductor engager 40 and surge responder 80 may be sufficiently close together such that a radial extension or protrusion need not extend radially outboard of the radial dimensions of the inner conductor engager 40.

While the in-line surge protector 10 is shown as including first and second threaded coupling portions 12, 14, other connecting interfaces are contemplated. For example, the coupling portions may not be threaded but may include a sliding interface to produce an interference fit between the coaxial cable and the body 16 of the surge protector 10.

The first and second coupling portions 12, 14 and the body 16 of the surge protector 10 may be fabricated from a metallic material such as copper, aluminum, brass, stainless steel, ferrule material or the like. In one embodiment, the inner conductor engager 40 and surge responder 80 may be fabricated from the same material. In others, the surge responder 80 may comprise a specific material that facilitates deformation during a surge and spring-back after a surge. Copper aluminum may include properties that facilitates return of the surge responder 80 to its original cylindrical shape after a surge.

In the embodiment shown, the body 16 is fabricated from a conductive material for grounding purposes and to prevent the surge responder 80 from radiating RF energy. This allows the in-line surge protector 10 to be maintain a suitable level of signal quality. In order to ensure that some metal structure completely surrounds the surge responder 80, the first and second housings 20, 22 form a step adjacent the insulating sleeve 24. Additionally, the insulating sleeve 24 may extend directly between and separate the first and second housings 20, 22, forming a corresponding L-shaped step therebetween.

By separating the body 16, the insulator 24 forces current through the surge responder 80 rather than through the outer or first housing 20. In one embodiment, the insulator 24 may be disposed between the surge responder 80 and entire length of the first housing 20 while in another embodiment, the insulator 24 is a small flanged piece to direct electric current. In this case, air may serve as the insulator between the surge responder 80 and the first housing 20. In other embodiments, the insulator 24 may also not have a stepped or flanged cross-sectional shape. Notwithstanding the cross sectional shape, the insulator 24 is configured to prevent current from flowing through the first housing during a surge. The insulator 24 may be fabricated of plastic, rubber, glass, porcelain, polymeric or other dielectric material.

In the embodiment depicted, insulating blocks 42, 46 support the surge responder 80 in position relative to the inner conductor engager 40 and the body 16. The insulating blocks 42, 46 may be fabricated from plastic, rubber, glass, porcelain, polymeric, or other dielectric material.

A resilient slotted mount 90 connects one end of the of the surge responder 80 to the body 16 to facilitate a small degree of motion therebetween as the surge responder 80 deforms in the surge or protect mode. That is, the slots of the resilient mount 90 form resilient fingers 92 which enable displacement and flexure of the surge responder 80 as the surge current deforms the strips 84. Additionally, the fingers 92 may also include a knob 94 at the terminal ends of each to facilitate a small degree of angular motion in addition to transverse and/or axial motion of the surge responder 80. The conductive member 90 prevents an open circuit as the surge responder 80 deforms under an electrical load. The circumferential slotted conductive member 90 may be made of a metallic material such as copper aluminum, brass, stainless steel, ferrule material or other conductive material.

Figure 3:
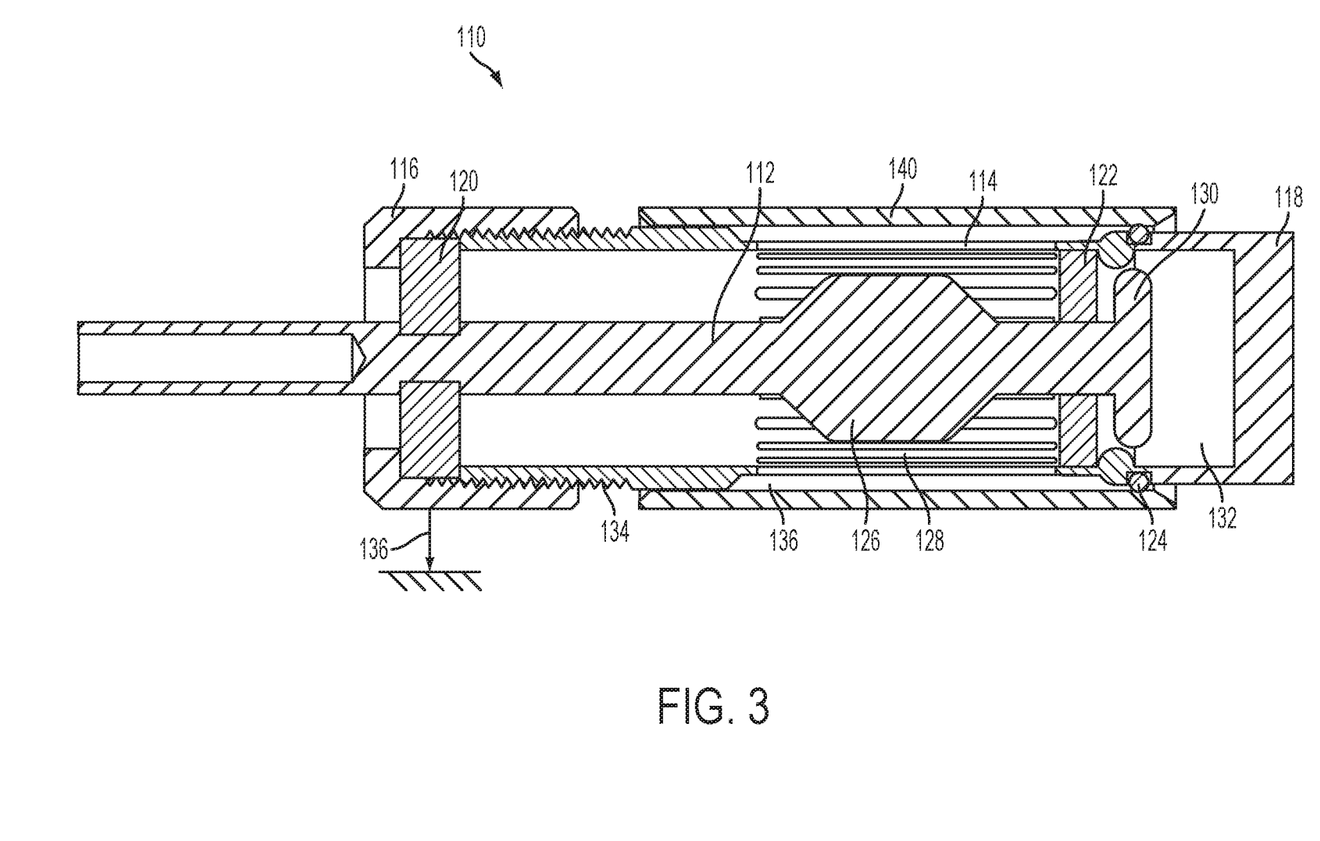
FIG. 3 depicts a sectional side view of a stub surge protector or stub surge protection device according to another embodiment of the disclosure.

Referring now to FIG. 3, a stub surge protector 110 is shown according to another embodiment. The stub surge protector 110 may be a quarter wave stub disposed within a T-shaped fitting operative to receive first and second coaxial cables (not shown). The first and second coaxial cables are separated to accept the pin of an inner conductor engager 112. The surge protector 110 includes an inner conductor engager 112 and a surge responder 114 that surrounds, and is spaced-apart from the inner conductor engager 112. The inner conductor engager 112 and surge responder 114 have similar components and elements to those described above in connection with the in-line surge protector 10. The surge responder 114 of the stub-wave protector 110 includes a plurality of flexible strips separated by slots to produce the same magnetic effect which produces the attraction and radial deformation of the strips toward a radial protrusion 126 of the inner conductor engager 112. While the stub surge protector 110 is only shown in the normal operating mode, i.e., not in the surge protection mode, when the strips deform radially inwardly to engage the radial protrusion 126 of the inner conductor engager 112, it should be understood that the surge protection mode would similarly resemble the surge protection mode shown in FIG. 2 in connection with the in-line surge protector 10.

The inner conductor engager 112 includes a central pin 114 which contacts the inner conductor of each of the coaxial cables (not shown). The central pin 114 extends at an angle, e.g., a right angle, relative to at least one of the coaxial cables and has a height or length dimension L equal to one-quarter of the wavelength of an RF signal. In the described embodiment, the central pin 114 has an elongate radial protrusion, relative to the disc-shaped protrusion of the in-line surge protector 10. Hence, it will be appreciated that the protrusion may have a two or three-dimensional shape and in the illustrated embodiment of FIG. 4, has a cylindrical shape.

Figure 4:
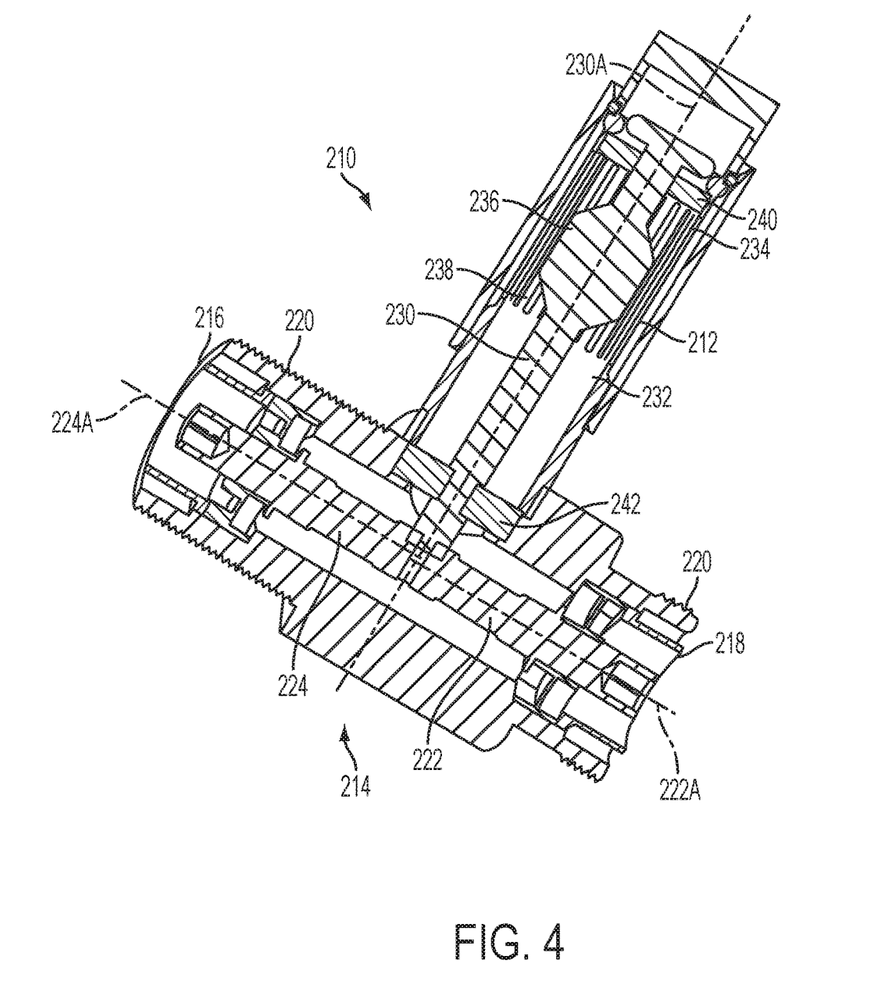
FIG. 4 depicts a sectioned perspective view of a stub surge protector or stub surge protection device having a "T" fitting for mating with a coaxial cable.
Figure 5:
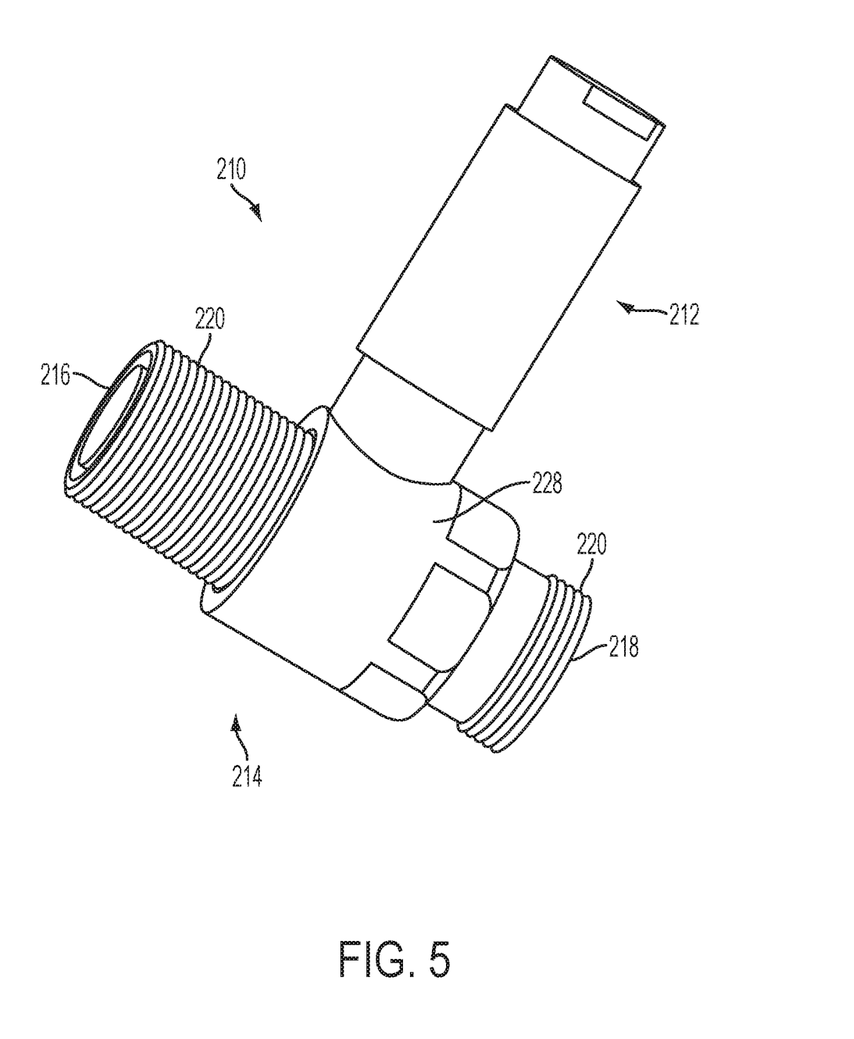
FIG. 5 depicts a perspective view of the stub surge protector of depicted in FIGS. 3 and 4.

The stub surge protector 110 may include a coupling interface 116 which is threadably engaged with an outer portion 134 of the surge responder 114 and which may include an internally threaded nut. The outer portion 134 of the surge responder 114 may integral therewith, or may be a separate element, as depicted in FIGS. 4 and 5. The coupling interface 116 may also attach to another portion of the stub surge protector 110, e.g., a T-fitting, including mating ends for connecting to the coaxial cables.

The stub surge protector 110 may include a first spacing member or insulator 120 similar to the insulating or spacing members 42, 46 of the in-line surge protector 10. The first spacing member 120 may be a circumferential ring that is configured to hold and mechanically support the surge responder elements 134, 114 in position between the coupling interface 116 and a stub end member 118. While in certain embodiments, the first spacing member 120 may not be necessary. In this embodiment, the spacing member functions to produce a seal between the threaded coupling interface 116 and outer portion 134 of the surge responder 114.

Relative to the coaxial cables, the stub end member 118 is located at the far end of the stub surge protector 110. The stub end member 118 may include an internal cavity 132 configured to house an expanded end 130 of the inner conductor engager 112. The cavity 132 may be configured to assist, inter alia, in assembly/disassembly of the stub surge protector 110. A second spacing member 122 biases the stub end member 118 against a portion of the inner conductor engager 112 located between the radial protrusion 126 and the expanded end 130.

The stub surge protector 110 may further include an outer conductive housing or body 140 that is spaced-apart from the surge responder 114. The outer conductive body is connected to ground by a grounding wire or device 136. The outer conductive housing or body 140 envelops, and contacts, the surge responder 114 to mitigate the loss of RF energy similar to the first housing 20 of the in-line surge protector. This facilitates a suitable quality of signal. Like the previous embodiment, an insulator element (not shown) may force surge current through the surge responder 114 rather than traveling through the outer conductive housing or body 140. Furthermore, a seal element 124 may ensure that the interior of the stub protector 110 is protected from the elements including water and the like.

In another embodiment illustrated in FIG. 4, a stub surge protector 210 includes a stub surge responder 212 that operates in the exact same manner as the stub surge protector 110, described hereinabove. Like the stub surge protector 110 described in the foregoing figures, the stub surge protector 210 shown in FIGS. 4 and 5, may be a quarter-wavelength stub having an inner conductor engager 230 and a surge responder 232 enveloping the inner conductor engager 230. The surge responder 232 defining a plurality of slots 234 that surround a radial protrusion 236 of the inner conductor engager 230. In addition to the elements described hereinabove in connection with the first stub surge protector 110, the second stub surge protector 210 may include a mating portion 214 for connecting in-line to coaxial cables. The stub surge portion 212 may be threadably connected or otherwise mated to the mating portion 214. Furthermore, the connection between the stub surge portion 212 and the mating portion 214 may be sealed from the elements to prevent water or other unwanted external substances from entering the stub surge protector 210. In other embodiments, the stub surge portion 212 may be integrally formed with the mating portion 214.

In FIG. 4, the elongate slots may be cut equiangularly about the elongate axis of the inner conductor engager 230. This is done to ensure that the elongate strips will have relatively equal stiffness properties and deform in a predictable/consistent manner. It will be recalled that a magnetic field is produced between the elongate strips and/or between the elongate strips and the inner conductor engager 230. The plurality of elongate strips produce a deformable basket disposed over a radial protrusion 236 of the inner conductor engager 230. While a plurality of elongate strips are depicted in this embodiment, it will be appreciated that any thin-walled conductive cylinder having strips or strands of conductive material disposed between first and second conductive ring portions will work in conjunction with the conductive protrusion 236. For example, a basket comprising a plurality of braided strands extending from one end of the cylinder can be configured to have similar surge protection benefits as the basket of longitudinal strips. The basket may include spiral strips having a longer effective length than strips which are strictly parallel to the elongate axis. The additional length may facilitate a larger radial displacement toward the radial protrusion 236 which may be desirable in certain applications of the stub surge protector.

The mating portion 214 may include a first mating end 216 and a second mating end 218 that each include threads 220 configured to receive a threaded coaxial cable connector in order to attach the stub surge protector 210 in line with a coaxial cable line. The first and second mating ends 216, 218 may each include a center conductor 222, 224 that connect the center conductor 226 of the stub surge portion 212. In the described embodiment, the center conductors 222, 224 need not be physically engaged or in contact with each other.

FIGS. 4 and 5 depict an outer housing 228 which connects to and at least partially envelops the surge protector 210. A first sealing member or O-ring is disposed between an upper portion of the surge responder 212 and the housing 228, while a second sealing member or O-ring is disposed between a lower portion of the surge responder 212 and the housing 228. The housing 228, therefore, covers the components of the surge protector 210 to prevent water, and other foreign objects, from infiltrating the elongate slots 234 between the elongate strips of the surge protector 210.

In the described embodiment, both the coaxial cables 222, 224 and the inner conductor engager 230 define axes. More specifically, the first and second coaxial cables 222, 224 each define a longitudinal axis 222A, 224A while the inner conductor engager 230 defines an elongate axis 230A. The inner conductor engager 230 is disposed substantially orthogonal, i.e., at right angles or perpendicular, to at least one of the first and second coaxial cables 222, 224. Furthermore, the inner conductor engager 230 is supported within the housing by first and second centering members 240, 242 disposed between upper and lower portions of the stub portion 210 and the housing 228.

Similar to the previous embodiment, the objective of the surge protector 210 is to drive a current spike between the stub responder 212 and the inner conductor engager 230. A current spike, or amperage/current above a threshold value, will cause the elongate strips to magnetically deform toward the inner conductor engager 230 thereby effecting a momentary short or current-to-ground through an outer housing 228. Thereafter, i.e., when the amperage/current has diminished below the threshold value, the elongate strips return to their initial shape/configuration such that an insulating gap is produced between the stub responder 212 and the inner conductor engager 230.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

The following is claimed:

1. A surge protection device comprising:
an inner conductor engager; and
a surge responder at least partially surrounding the inner conductor engager and including a plurality of flexible elements responsive to a current greater than a threshold amperage value, the flexible elements deforming toward the inner conductor engager to produce an electrical short with the inner conductor engager when the current is greater than the threshold amperage value and moving away from the inner conductor engager to sever the electrical short when the current is less than or equal to the threshold amperage value to facilitate RF signal transmission.

2. The surge protection device of claim 1, wherein the inner conductor engager defines an elongate axis, and wherein the plurality of flexible elements includes a plurality of elongate strips defining a cylindrical shape circumscribing the inner conductor engager.

3. The surge protection device of claim 1 wherein the plurality of flexible elements includes a thin-walled conductive cylinder having a plurality of elongate slots cut into the thin-walled cylinder to form a plurality of elongate strips.

4. The surge protection device of claim 3 wherein the slots are cut in equiangular increments so as to produce slots having substantially equal stiffness properties.

5. The surge protection device of claim 1 wherein the surge responder comprises first and second annual rings and a deformable basket disposed between the annular rings, the deformable basket comprising a plurality of flexible elements configured to deform radially inboard toward the inner conductor engager so as to produce the electrical short therebetween.

6. The surge protection device of claim 5 wherein the first and second annular rings receive a sealing member between each annual ring and an outer housing.

7. The surge protection device of claim 2, wherein the inner conductor engager includes a radial protrusion between first and second ends thereof, and wherein the radial protrusion and elongate strips define a first annular gap having a threshold dimension sufficient to insulate the inner conductor engager from the radial protrusion of the inner conductor engager in a normal operating mode, and defining a second annular gap having a threshold dimension sufficient to permit electrical arcing between the inner conductor engager and the radial protrusion in a surge protecting operating mode.

8. The surge protection device of claim 7, wherein the inner conductor engager contacts a portion of the radial protrusion to produce the electrical short therebetween.

9. The surge protection device of claim 1, wherein the inner conductor engager defines one end which intersects, contacts, and protects first and second cable segments.

10. The surge protection device of claim 1, further comprising a first coupling portion configured to engage a first coaxial cable, a second coupling portion configured to engage a second coaxial cable and wherein one end of the inner conductor engager is configured to engage the inner conductor of each coaxial cable.

11. The surge protection device of claim 10 wherein the inner conductor engager has a length dimension equal to about one-quarter of the wavelength of an RF signal.

12. The surge protection device of claim 11, wherein one of the first and second coaxial cables define an elongate axis and wherein the inner conductor engager defines a longitudinal axis which is substantially orthogonal to the elongate axis of one of the first and second coaxial cables.

13. The surge protection device of claim 12, further comprising a pair of centering members disposed between the surge responder and a housing.

14. The surge protection device of claim 13, the further comprising a resilient mount disposed between the housing and at least one end of the surge responder to facilitate displacement of the surge responder in the surge protection operating mode.

15. The surge protection device of claim 5 wherein the deformable basket includes a plurality of spiral strips.

16. A surge protector interposing first and second coaxial cables comprising:
a surge protection device including an inner conductor engager and a surge responder, the surge responder enveloping the inner conductor engager and including a plurality of flexible elements deflecting toward the inner conductor engager to produce an electrical short when a current is greater than a threshold amperage and moving away from the inner conductor engager when the current is less than the threshold amperage; and a conductive housing defining openings for receiving a first coaxial cable, a second coaxial cable and the surge protecting device; the openings being configured such that: (i) an inner conductor of each cable is opposing and substantially coaxial along an axis, (ii) an outer conductor of each cable is electrically connected to the conductive housing; (iii) the inner conductor engager of the surge protection device contacts each of the inner conductors of the first and second coaxial cables; and (iv) the inner conductor engager and surge responder of the surge protection device are substantially orthogonal to the axis of the inner conductors of each cable.

17. The surge protector of claim 16 wherein the inner conductor engager has a length dimension equal to about one-quarter of the wavelength of an RF signal.

18. The surge protector of claim 16, wherein the inner conductor engager defines an elongate axis, and wherein the plurality of flexible elements includes a plurality of elongate strips defining a cylindrical shape circumscribing the inner conductor engager.

19. The surge protector of claim 16, wherein the inner conductor engager includes a radial protrusion between first and second ends thereof, and wherein the radial protrusion and flexible elements define a first annular gap having a threshold dimension sufficient to electrically insulate the inner conductor engager from the radial protrusion of the inner conductor engager in a normal operating mode, and defining a second annular gap having a threshold dimension sufficient to permit electrical arcing between the inner conductor engager and the radial protrusion in a surge protecting operating mode.

20. The surge protector of claim 19, wherein the inner conductor engager contacts a portion of the radial protrusion to produce the electrical short therebetween.

* * * * *